US010923211B1

(12) United States Patent
Eisenhuth

(10) Patent No.: US 10,923,211 B1
(45) Date of Patent: Feb. 16, 2021

(54) EFFICIENT SCRAMBLING AND ENCODING FOR COPYBACK PROCEDURES IN A MEMORY SUBSYSTEM

(71) Applicant: Micron Technology, Inc., Boise, ID (US)

(72) Inventor: Robert B. Eisenhuth, Boulder, CO (US)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

(21) Appl. No.: 16/730,809

(22) Filed: Dec. 30, 2019

(51) Int. Cl.
*G11C 29/42* (2006.01)
*G11C 29/06* (2006.01)
*G06F 9/30* (2018.01)
*G06F 7/58* (2006.01)
*G11C 29/44* (2006.01)

(52) U.S. Cl.
CPC .............. *G11C 29/42* (2013.01); *G06F 7/582* (2013.01); *G06F 9/30029* (2013.01); *G11C 29/06* (2013.01); *G11C 29/44* (2013.01)

(58) Field of Classification Search
CPC ......... G11C 29/42; G11C 29/44; G11C 29/06; G06F 7/582; G06F 9/30029
See application file for complete search history.

(56) References Cited

U.S. PATENT DOCUMENTS 9,973,481 B1 * 5/2018 Sharifi Mehr ........ H04L 9/0825
2020/0112395 A1 * 4/2020 Carsello ................... H04L 69/22

* cited by examiner

*Primary Examiner* — Ajay Ojha
(74) *Attorney, Agent, or Firm* — Nicholson De Vos Webster & Elliott LLP

(57) ABSTRACT

A method for performing a copyback procedure is described. The method includes determining to move first encoded data from a first location in a memory die to a second location. In response to determining to move the first encoded data from the first location to the second location, a starting seed, which is associated with the first location, is combined with a destination seed, which is associated with the second location, to produce a combined seed. Based on the combined seed, the method generates a pseudorandom sequence and combines the first encoded data with the pseudorandom sequence to produce second encoded data. In this configuration, the first encoded data is scrambled based on the starting seed while, based on combining the first encoded data with the pseudorandom sequence, the second encoded data is scrambled based on the destination seed. Thereafter, the second encoded data is stored in the second location.

20 Claims, 19 Drawing Sheets

| SEED 310A | SEED 310B | DIFFERENCE/COMBINED SEED 310C | PSEUDORANDOM SEQUENCE 318 | FIRST ENCODED DATA 320A | SECOND ENCODED DATA 320B |
|---|---|---|---|---|---|
| 0101 | 1100 | 1001 | 11100011 | 00110011 | 11010000 |

FIG. 4

| SEED 310A | SEED 310B | DIFFERENCE/COMBINED SEED 310C | PSEUDORANDOM SEQUENCE 318 | ENCODED PSEUDORANDOM SEQUENCE 604 | FIRST ENCODED DATA 320A | SECOND ENCODED DATA 320B |
|---|---|---|---|---|---|---|
| 0101 | 1100 | 1001 | 110100 | 11010001 | 00110001 | 11100000 |

FIG. 7

| OLD FIELD VALUE 902A | NEW FIELD VALUE 902B | DIFFERENCE/ COMBINED FIELD VALUE 906 | PADDED FIELD VALUE 910 | ENCODED FIELD VALUE 912 | FIRST ENCODED DATA 320A | SECOND ENCODED DATA 320B |
|---|---|---|---|---|---|---|
| 01 | 00 | 01 | 000010 | 00001010 | 00101001 | 00100011 |

FIG. 10

| SEED 310A | SEED 310B | DIFFERENCE/ COMBINED SEED 310C | PSEUDORANDOM SEQUENCE 318 | OLD FIELD VALUE 902A | NEW FIELD VALUE 902B | DIFFERENCE/ COMBINED FIELD VALUE 906 | PADDED FIELD VALUE 910 | FIELD AND SEQUENCE 1204 | ENCODED FIELD AND SEQUENCE 1206 | FIRST ENCODED DATA 320A | SECOND ENCODED DATA 320B |
|---|---|---|---|---|---|---|---|---|---|---|---|
| 0101 | 1100 | 1001 | 110100 | 01 | 00 | 01 | 000010 | 110110 | 11011011 | 00101001 | 11100010 |

EFFICIENT SCRAMBLING AND ENCODING FOR COPYBACK PROCEDURES IN A MEMORY SUBSYSTEM

TECHNICAL FIELD

The present disclosure generally relates to copyback procedures, and more specifically, relates to efficient scrambling and encoding for copyback procedures in a memory subsystem.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 illustrates a first set of example values for a copyback procedure, in accordance with some embodiments of the present disclosure.

FIG. 7 illustrates a second set of example values for a copyback procedure, in accordance with some embodiments of the present disclosure.

FIG. 10 illustrates a third set of example values for a copyback procedure, in accordance with some embodiments of the present disclosure.

FIG. 13 illustrates a fourth set of example values for a copyback procedure, in accordance with some embodiments of the present disclosure.

DETAILED DESCRIPTION

Figure 1:
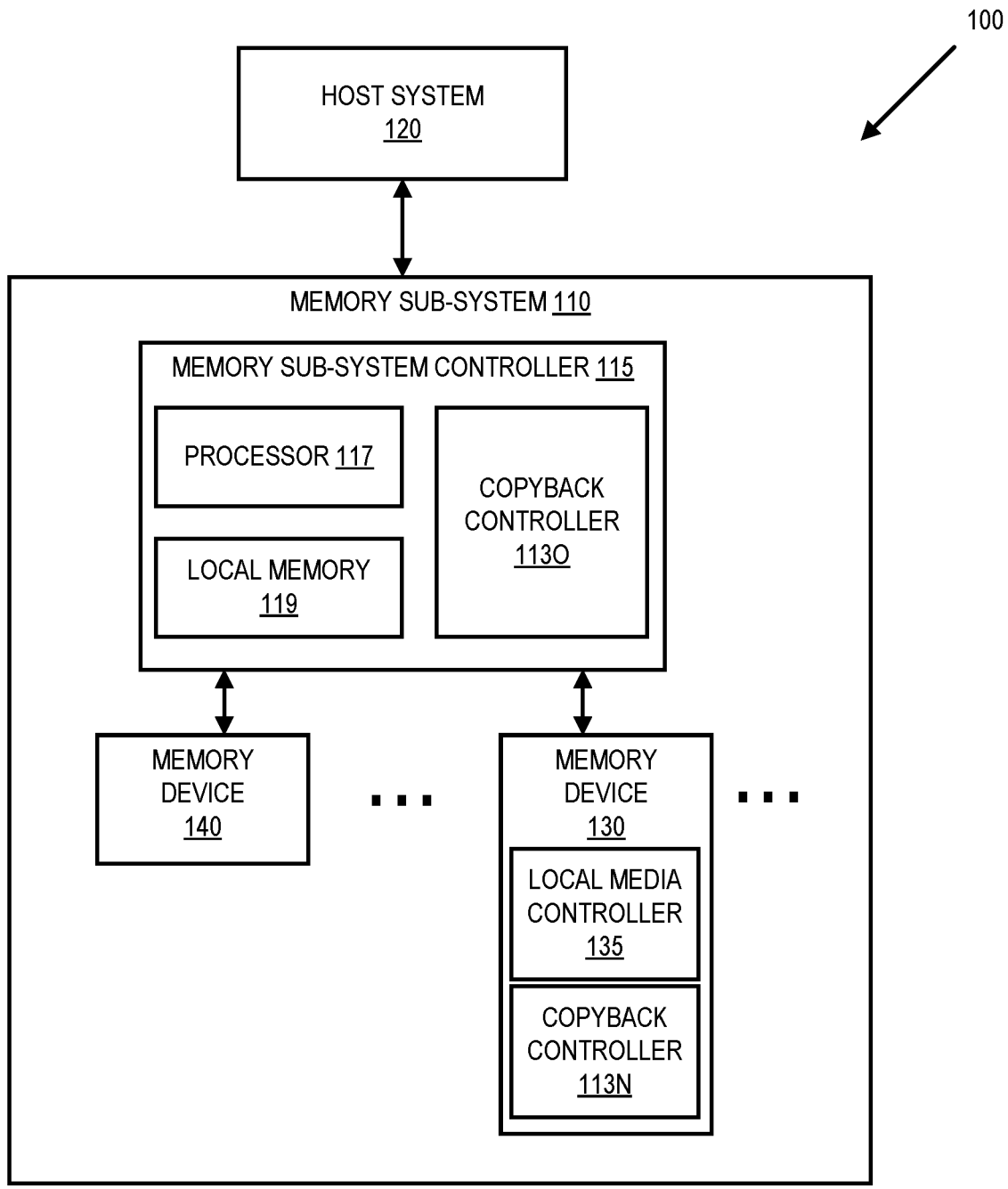
FIG. 1 illustrates an example computing system that includes a memory subsystem in accordance with some embodiments of the present disclosure.

Aspects of the present disclosure are directed to efficient scrambling and encoding for memory operations, including copyback procedures in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative- and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Memory subsystems can perform copyback procedures in which data is moved from one location/address in the memory subsystem to another location/address within the memory subsystem. A memory subsystem commonly performs copyback procedures without movement of data outside the memory devices of the memory subsystem (e.g., without transferring the data to a memory subsystem controller). By maintaining the data within the memory devices, the memory subsystem avoids expending time and power to transfer the data outside of the memory devices and then back into the memory devices for storage. Despite this desire to maintain the data completely within the memory devices during a copyback procedure, sometimes the data is scrambled or otherwise encoded based on a storage location of the data and movement of the data outside the memory devices is needed to facilitate encoding changes. For example, the memory subsystem could employ a scrambling technique to ensure data values are not repeated within the memory devices. In particular, in some types of memory (e.g., dynamic random-access memory (DRAM)), repeated unset cells (e.g., cells with the value of "0") in a particular row with consequent reads of these unset cells could cause charge to leak out of neighboring rows. This results in data errors and/or data loss. Further, in some types of memory (e.g., NAND), repeatedly setting the same cells (e.g., writing cells with the value of "1") could cause excessive wear to these cells as the memory subsystem is always applying the highest voltage to these cells. In other types of memory, repeatedly setting the same cells (e.g., cells with the value of "1") could cause an imprint phenomenon where the cells are stuck in this set state.

To account for these potential issues, a memory subsystem controller performs a scrambling procedure based on seeds that are mapped to separate locations/addresses in the memory subsystem. Accordingly, during a copyback procedure where the location of data changes, the memory subsystem transfers the scrambled data from the memory devices to the memory subsystem controller. The memory subsystem controller descrambles the scrambled data using a first seed, which is mapped to the starting location of the data, scrambles the data using a second seed, which is mapped to the destination location, and writes the newly scrambled data to the destination location in the memory devices. The complexity of the scrambling procedure and the traditional memory subsystem configuration in which the memory subsystem controller controls scrambling of data necessitates the transfer of data between the memory devices and the memory subsystem controller to account for scrambling during a copyback procedure. The need for the memory subsystem to transfer data from the memory devices to the memory subsystem controller is increased when error correction coding (ECC) is applied to the scrambled data and/or when metadata within the data needs to be changed to reflect a new location of the data (e.g., a field value that indicates the address where the data is stored in the memory devices or is otherwise based on the address where the data is stored in the memory devices). Namely, the data needs to be (1) decoded using an ECC decoder and re-encoded using an ECC encoder and/or (2) adjusted to account for a changed field value before returning to the memory devices and written to the destination location. As noted above, this transfer of data between the memory devices and the memory subsystem controller adds significant delay, power consumption, and complexity to the copyback procedure.

Aspects of the present disclosure address the above and other deficiencies by accelerating scrambling and encoding for copyback procedures by exploiting properties of certain encoding techniques. In particular, some encoding functions possess the distributive property. The distributive property can be expressed as: if $Y1=F(X1)$ and $Y2=F(X2)$ then $Y1 \oplus Y2 = F(X1 \oplus X2)$. Based on the distributive property, encoded data does not need to be decoded such that changes to the encoding and/or data being encoded can be made. Instead, the differences between the originally encoded data and the newly encoded data can be determined and these differences can be applied to the originally encoded data to produce the newly encoded data. For example, when the memory subsystem begins the transfer of encoded/scrambled data from a first location in the memory devices to a second location, the memory subsystem can determine a difference between a starting seed, which corresponds to the first location and is used to scramble the data in the first location, and a destination seed, which corresponds to the second location and is to be used to scramble the data for storage in the second location. In particular, the memory subsystem performs an exclusive-or with the starting seed and the destination seed to produce a combined/difference seed. The memory subsystem can use the combined seed to generate a pseudorandom sequence, which represents the difference between how the data is currently encoded in the first location and how the data should be encoded for storage in the second location. In this configuration, the memory subsystem controller passes the pseudorandom sequence, which is determined using the combined seed, to the memory devices to exclusive-or the pseudorandom sequence with the currently encoded data. In the same fashion as described above in relation to scrambling data, the memory subsystem can utilize the distributive property, which relies on differences between starting and target data, for updating ECC and/or making changes to field values. Using this approach, time, power, and complexity devoted to (1) moving data between the memory devices and a memory subsystem controller and (2) decoding/descrambling of data can be avoided.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative- and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes one or more copyback controllers 113O,113N that can efficiently perform copyback procedures by exploiting the distributive property of scrambling/encoding processes. In some embodiments, the controller 115 includes at least a portion of the copyback controllers 113 (e.g., the copyback controller 113O). For example, the controller 115 can include a processor 117 (processing device) configured to execute instructions stored in local memory 119 for performing the operations described herein. In some embodiments, a copyback controller 113 is part of the host system 110, an application, or an operating system.

In some embodiments, the copyback controller 113O works in conjunction with one or more copyback controllers 113N in the memory devices 130 to perform a single copyback procedure. In particular, the copyback controller 113O can generate a difference/encoded value, which represents changes to an original set of encoded data (e.g., user data, metadata, and/or parity bits). The copyback controller 113O can pass the difference value to a copyback controller 113N in the memory devices 130 Thereafter, the copyback controller 113N in the memory devices 130 (i.e., a copyback controller 113 within a memory die) can apply the difference value to the original set of encoded data to generate a new set of encoded data such that the new set of encoded data can be copied/moved to a new location in the memory devices 130 to complete the copyback procedure.

As noted above, the copyback controller 113 can efficiently perform copyback procedures by exploiting the distributive property of scrambling/encoding processes. Further details with regards to the operations of the copyback controller 113 are described below.

Figure 2:
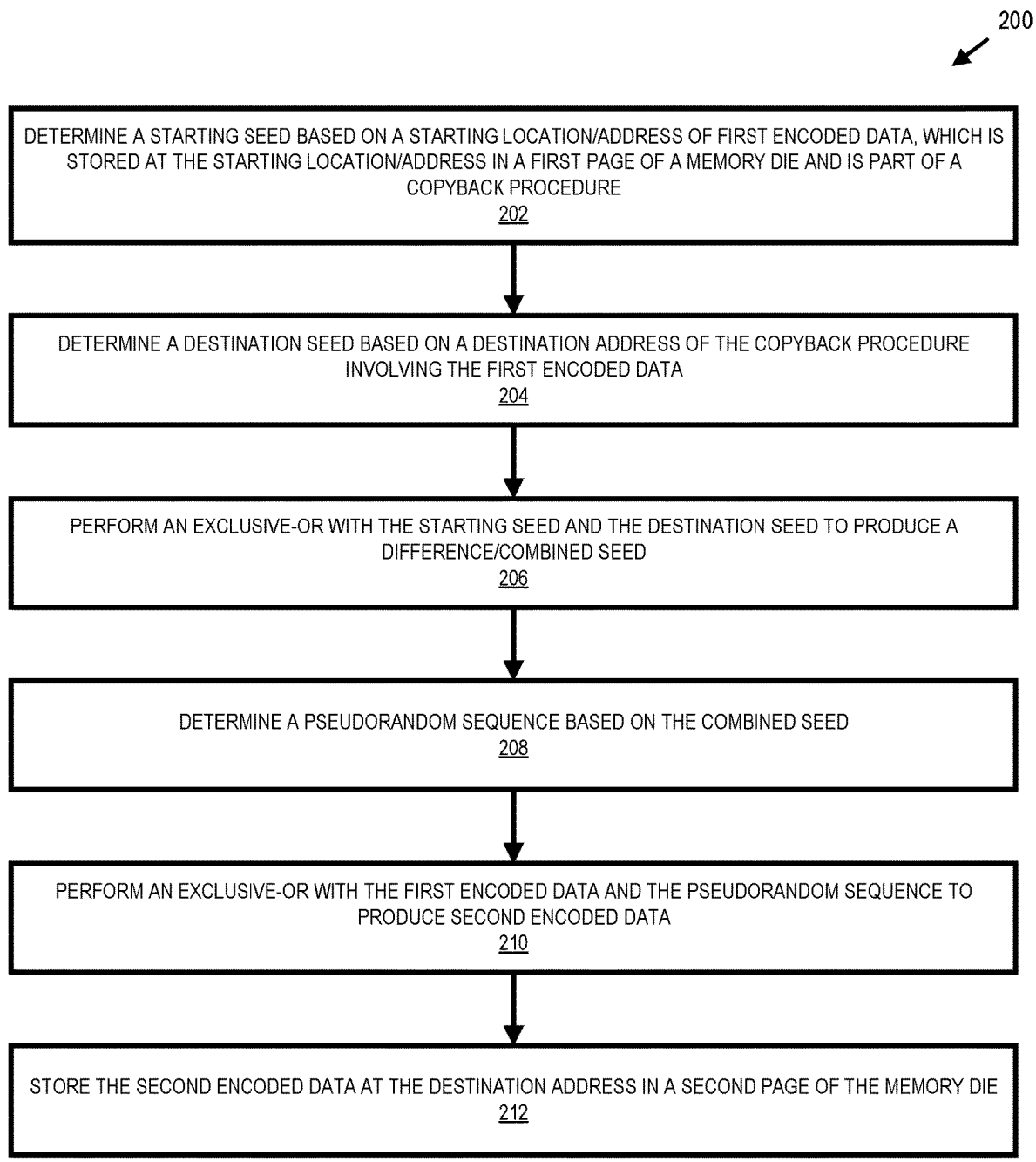
FIG. 2 is a flow diagram of a first example method to efficiently perform a copyback procedure in a memory subsystem, in accordance with some embodiments of the present disclosure.

FIG. 2 is a flow diagram of an example method 200 to efficiently perform a copyback procedure in a memory subsystem 110, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by one or more copyback controllers 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 200 will be described in relation to the copyback system 300 shown in FIG. 3. Although described in relation to the copyback system 300, the processing device can perform the method 200 in relation to other systems. Accordingly, the use of the copyback system 300 is for illustrative purposes.

At operation 202, the processing device determines a starting seed 310A of first encoded data 320A, which is stored at a starting address 306A in a first page $304_1$ in the memory subsystem 110. In particular, as described here in relation to the method 200 and shown in FIG. 3, the processing device is performing a copyback procedure to copy/move data (e.g., the user data represented by the first encoded data 320A) from a starting location (e.g., a location/address 306A in the NAND page $304_1$) to a destination location (e.g., a location/address 306B in the NAND page $304_A$). As shown, the copyback procedure is copying/moving data between pages 304 within the same NAND array 302 (sometimes referred to as a NAND block 302) and within the same memory die 324. However, in other embodiments, the copyback procedure can copy/move data between NAND pages 304 of different NAND arrays 302 and/or different NAND dice 324. The processing device can perform the copyback procedure in furtherance of one or more objectives, including (1) garbage collection within the memory devices 130 or (2) moving data between portions of memory having different bit densities (e.g., from SLC to TLC or to QLC). As described herein, the data to be copied (e.g., the first encoded data 320A, which is represented by the bits $D0_1$-$D7_1$) has been scrambled. This scrambling includes applying a pseudorandom sequence to data (e.g., performing an exclusive-or with the data and the pseudorandom sequence to generate the first encoded data 320A). The processing device selects the pseudorandom sequence based on the storage location of the first encoded data 320A. For example, as shown in FIG. 3, the seed selector 308 receives a starting address 306A, which corresponds to a starting address 306A in the NAND array 302 where the first encoded data 320A is stored. The starting address 306A can be the address of the NAND page 304 where the first encoded data 320A is stored (e.g., the address of the NAND page $304_1$) or a location within the NAND page 304 where the first encoded data 320A is stored. Based on the starting address 306A, the seed selector 308 indicates the seed 310A (sometimes referred to as the starting seed 310A), which corresponds to the seed 310 that was used to scramble/encode the first encoded data 320A. In some embodiments, the seed selector 308 is a one-to-one function that takes an address 306 as input (e.g., the starting address 306A) and outputs a seed 310 (e.g., the seed 310A), while in other embodiments, the seed selector 308 is a table that is indexed based on addresses 306. The processing device could use seeds 310 to generate corresponding pseudorandom sequences that are directly used to scramble data. However, as will be described below, the processing device ensures an accelerated and efficient procedure for scrambling data during a copyback procedure by taking into account a destination seed 310B corresponding to a destination location/address 306B along with the starting seed 310A corresponding to the starting location/address 306A.

At operation 204, the processing device determines the destination seed 310B based on a destination address 306B for the copyback procedure involving the first encoded data 320A. For example, as shown in FIG. 3, the seed selector 308 receives a destination address 306B, which corresponds to a location in the NAND array 302 that will be the destination of the copyback procedure. Similar to the starting address 306A, the destination address 306B is an address of a NAND page 304 (e.g., the address of the NAND page $304_A$) or a location within a NAND page 304. Based on the destination address 306B, the seed selector 308 indicates the seed 310B (sometimes referred to as the destination seed 310B).

Figure 3:
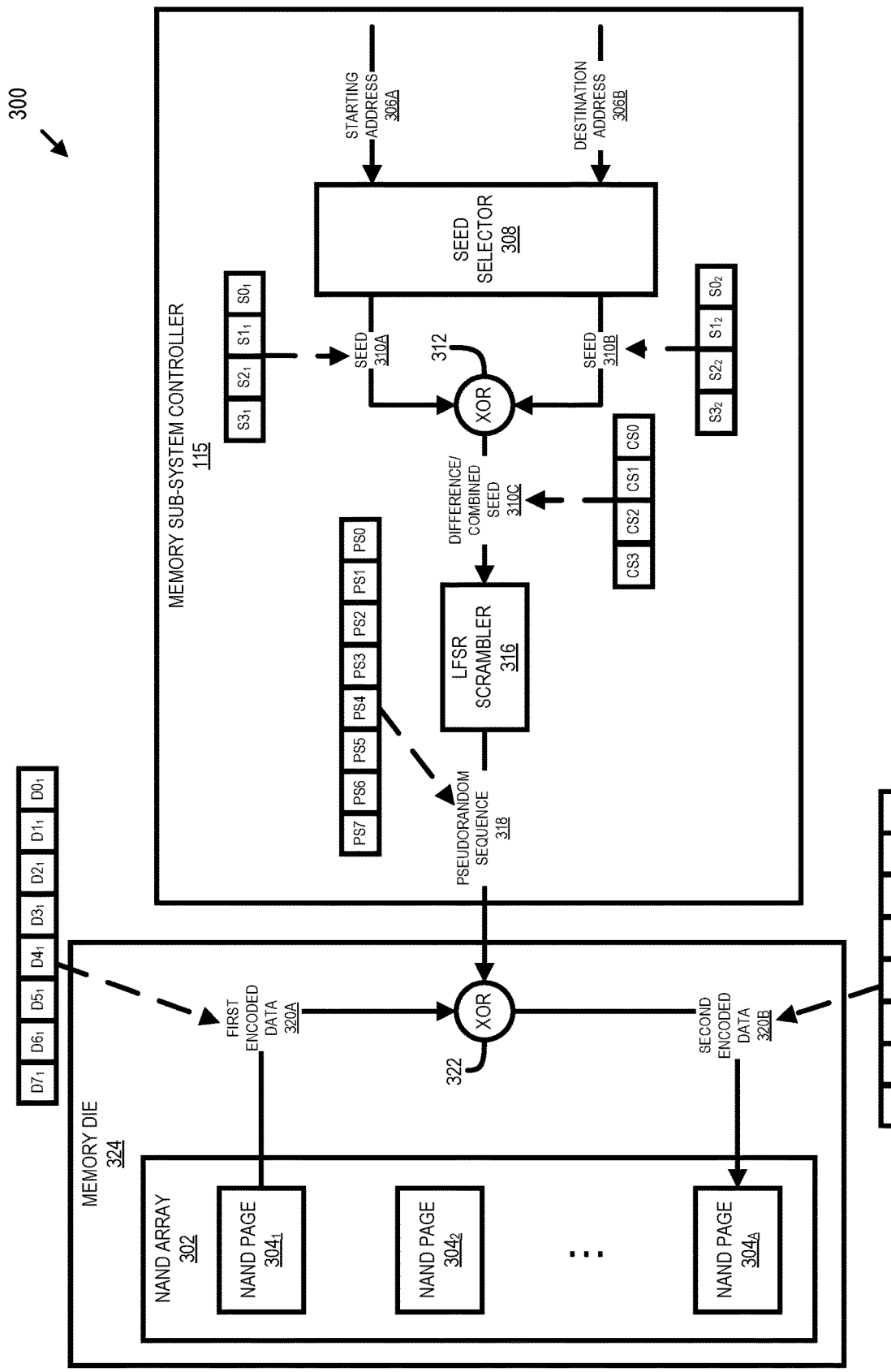
FIG. 3 illustrates a first example copyback system to perform a copyback procedure, in accordance with some embodiments of the present disclosure.

As shown in FIG. 3, the starting seed 310A is represented by four bits $S0_1$-$S3_1$ and the destination seed 310B is represented by the four bits $S0_2$-$S3_2$. In other embodiments, the seeds 310A and 310B can be any length (e.g., 16-20 bits in length). Accordingly, the use of the four bits $S0_1$-$S3_1$ for the starting seed 310A and the four bits $S0_2$-$S3_2$ for the destination seed 310B is for purposes of illustration.

FIG. 4 shows example values for the seed 310A and the seed 310B. As shown in FIG. 4, the seed 310A has the value "0101" and the seed 310B has the value "1100". These example values for the seed 310A and the seed 310B will be used to describe the method 200 below. However, it is understood that other values could be used.

At operation 206, the processing device combines the starting seed 310A and the destination seed 310B by performing an exclusive-or with the starting seed 310A and the destination seed 310B to generate a combined seed 310C (sometimes referred to as a difference seed 310C). For example, as shown in FIG. 3, the exclusive-or 312 takes the seed 310A and the seed 310B to generate the combined seed 310C. The combined seed 310C represents the difference between the seed 310A and the seed 310B. In particular, the combined seed 310C, which is represented by the four bits CS0-CS3, is equal to CSX=$SX_1 \oplus SX_2$ for each value of X between 0 and 3. In the example shown in FIG. 4, the exclusive-or 312 processes the seed 310A with the value "0101" and the seed 310B with the value "1100" to produce the combined seed 310C with the value "1001".

Although described throughout as the processing device combining values with an exclusive-or, the processing device can combine with any similar functions or techniques. For example, instead of using an exclusive-or function, the processing device can combine values using a set of NAND (not-AND) and/or XNOR (exclusive not-OR) functions. For instance instead of the processing device combining the starting seed 310A with the destination seed 310B using an exclusive-or function at operation 206, the processing device can combine the starting seed 310A and the destination seed 310B at operation 206 according to the following: A XOR B=(starting seed NAND (starting seed NAND destination seed)) NAND (destination seed NAND (starting seed NAND destination seed)).

At operation 208, the processing device determines a pseudorandom sequence 318 based on the combined seed 310C. For example, as shown in FIG. 3, the linear-feedback shift register (LFSR) scrambler 316 uses the combined seed 310C to generate the pseudorandom sequence 318, which is represented by the bits PS0-PS7. The LFSR scrambler 316 is a set of deterministic logic structures that uses a seed value (e.g., the combined seed 310C) to produce sequences of bits that appear random (e.g., the pseudorandom sequence 318). As shown in FIG. 4, the LFSR scrambler 316 produces the pseudorandom sequence 318 with the value "11100011" based on the combined seed 310C with the value "1001". Although described as using an LFSR scrambler, any type of scrambler can be used to generate the pseudorandom sequence 318 as long as it meets the distributive property.

At operation 210, the processing device combines the pseudorandom sequence 318 and the first encoded data 320A by performing an exclusive-or with the pseudorandom sequence 318 and the first encoded data 320A to produce second encoded data 320B. For example, as shown in FIG. 3, the exclusive-or 322 takes the pseudorandom sequence 318 and the first encoded data 320A to produce the second encoded data 320B. In this configuration, while the first encoded data 320A, which is represented by the bits $D0_1$-$D7_1$, is scrambled using the seed 310A, the second encoded data 320B, which is represented by the bits $D0_2$-$D7_2$, is scrambled using the seed 310B. In this fashion, the pseudorandom sequence 318 represents the differences between the first encoded data 320A and the second encoded data 320B and the processing device uses the pseudorandom sequence 318 to alter the first encoded data 320A to arrive at the second encoded data 320B. As shown in example data of FIG. 4, the exclusive-or 322 takes the pseudorandom sequence 318 with the value "11100011" and the first encoded data 320A with the value "00110011" to produce the second encoded data 320B with the value "11010000".

At operation 212, the processing device stores the second encoded data 320B at the destination address 306B in a second page 304. For example, the processing device stores the second encoded data 320B with the value "11010000" at the destination address 306B within the NAND page $304_A$ at operation 212.

As shown in FIG. 3, the operations related to generation of the pseudorandom sequence 318 are performed in the controller 115, while the combination of the pseudorandom sequence 318 with the first encoded data 320A is performed in the memory die 324. Accordingly, the first encoded data 320A does not need to be transferred outside the memory die 324. In this fashion, time and power devoted to transferring the encoded data 320A outside the memory die 324 can be avoided. In some embodiments, one or more operations and/or logic shown as being performed in the controller 115 can be performed in the memory die 324. Accordingly, the distribution of operations and logic shown in FIG. 3 is the minimum distribution in relation to the operations of the memory die 324.

As described above, the method 200 performs a copyback procedure without (1) transferring the first encoded data 320A outside the memory die 324 and (2) descrambling/decoding the first encoded data 320A. Instead, the method 200 exploits the distributive property of the scrambling process performed by the LFSR scrambler 316 to avoid additional time, power, and complexity to (1) move data between the memory devices 130 and a controller 115 of the memory subsystem 110 and (2) decode/descramble data.

In some cases, the first encoded data 320A is ECC encoded in addition to being scrambled. For ECC encoding techniques that also have the distributive property (e.g., Bose-Chaudhuri-Hocquenghem (BCH) coding), the memory subsystem 110 can employ a similar technique to that described in relation to the method 200 and the copyback system 300 to limit overhead when performing a copyback procedure.

Figure 5:
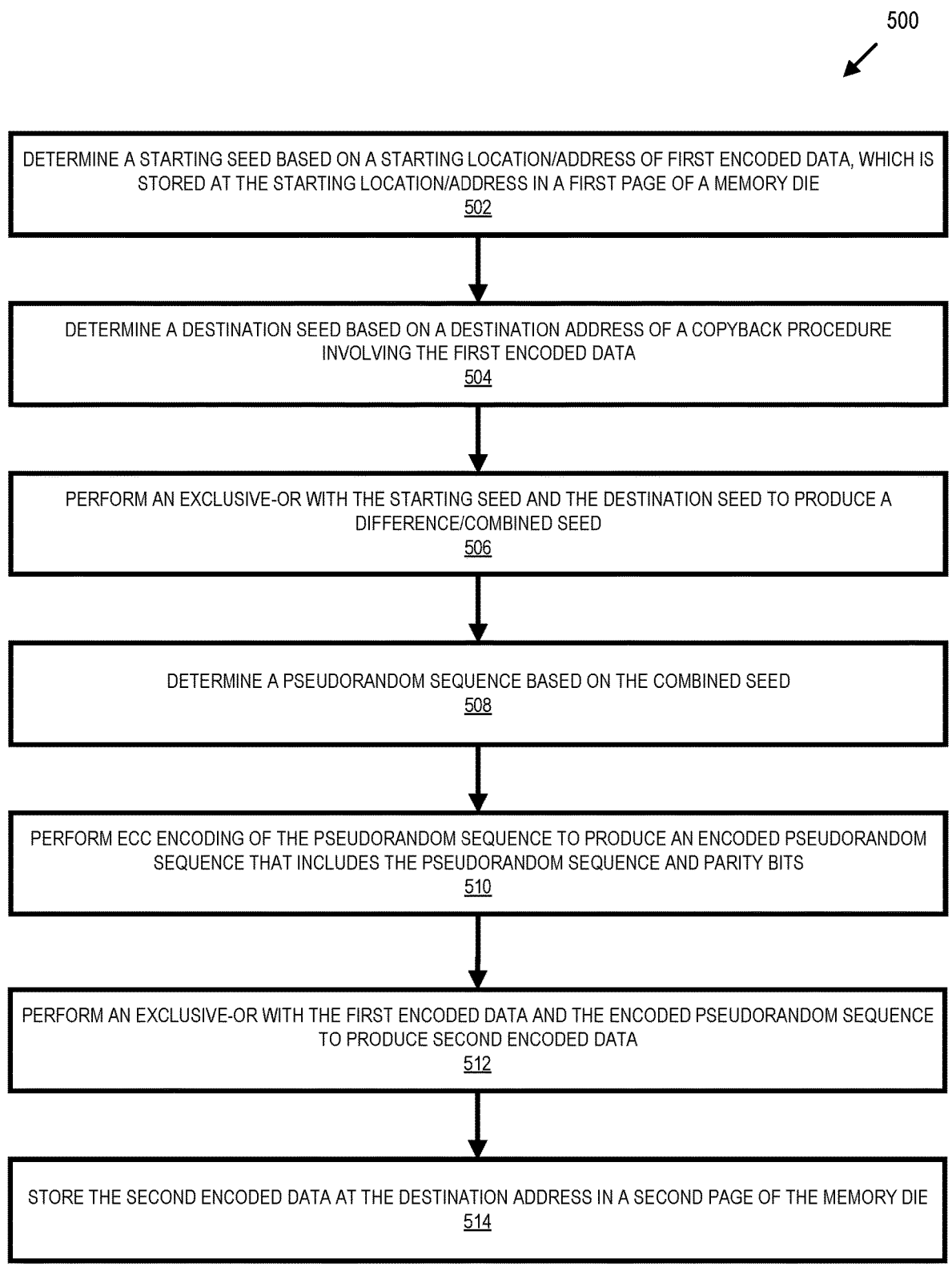
FIG. 5 is a flow diagram of a second example method to efficiently perform a copyback procedure in a memory subsystem, in accordance with some embodiments of the present disclosure.

For example, FIG. 5 is a flow diagram of another example method 500 to efficiently perform a copyback procedure in a memory subsystem 110, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by one or more copyback controllers 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 6:
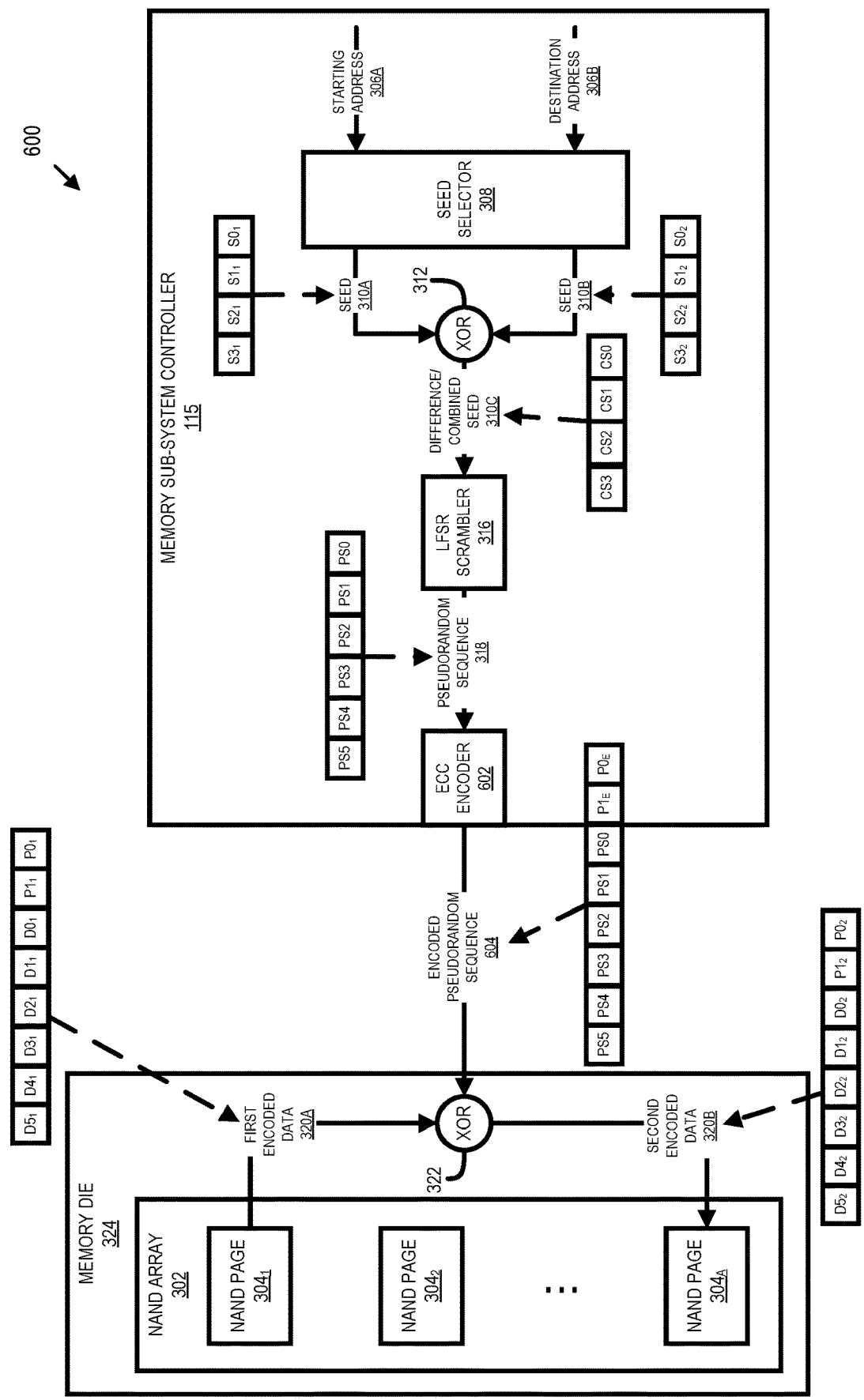
FIG. 6 illustrates a second example copyback system to perform a copyback procedure, in accordance with some embodiments of the present disclosure.

The method 500 will be described in relation to the copyback system 600 shown in FIG. 6. Although described in relation to the copyback system 600, the processing device can perform the method 500 in relation to other systems. Accordingly, the use of the copyback system 600 is for illustrative purposes.

As shown in FIG. 5, the processing device can perform the operations 502-508 in a similar fashion to the operations 202-208 of the method 200, respectively. Namely, since the first encoded data 320A is also scrambled using a starting seed 310A but needs to be scrambled using the destination seed 310B, generating a pseudorandom sequence 318 based on the starting seed 310A and the destination seed 310B can be accomplished in the same way in the method 500 using the techniques of the method 200. As shown in the example values of FIG. 7, the pseudorandom sequence 318 is represented by the bits PS0-PS5 as shown in FIG. 6, and has the value "110100". In this configuration, the pseudorandom sequence 318 has been shortened (in comparison to the copyback system 300) to account for parity bits, which will be added via ECC encoding.

Following the processing device generating the pseudorandom sequence 318 at operation 508, the processing device performs ECC encoding on the pseudorandom sequence 318 to produce an encoded pseudorandom sequence 604 at operation 510. For example, as shown in FIG. 6, the ECC encoder 602 processes the pseudorandom sequence 318, which is represented by the six bits PS0-PS5, to generate the encoded pseudorandom sequence 604, which includes the pseudorandom sequence 318 (i.e., the bits PS0-PS5) and a set of parity bits (i.e., the bits $P0_E$ and $P1_E$). In this configuration, the pseudorandom sequence 318 portion of the encoded pseudorandom sequence 604 represents the difference between (1) the data bits $D0_1$-$D5_1$ of the first encoded data 320A, which are scrambled based on the seed 310A and (2) the data bits $D0_2$-$D5_2$ of the second encoded data 320B, which are to be scrambled based on the seed 310B. Further, the parity bits (i.e., the bits $P0_E$ and $P1_E$) represent the difference between (1) the parity bits $P0_1$ and $P1_1$ of the first encoded data 320A and (2) the parity bits $P0_2$ and $P1_2$ of the second encoded data 320B. As shown in FIG. 7, ECC encoder 602 generates the encoded pseudorandom sequence 604 with the value "11010001" based on the pseudorandom sequence 318 with the value "110100".

At operation 512, the processing device combines the encoded pseudorandom sequence 604 and the first encoded data 320A by performing an exclusive-or with the encoded pseudorandom sequence 604 and the first encoded data 320A to produce the second encoded data 320B. For example, as shown in FIG. 6, the exclusive-or 322 takes the encoded pseudorandom sequence 604 and the first encoded data 320A to produce the second encoded data 320B. In this configuration, while the first encoded data 320A is scrambled using the seed 310A, the second encoded data 320B is scrambled using the seed 310B while still maintaining proper ECC encoding based on the distributive property of this encoding procedure. For instance, as shown in FIG. 7, the exclusive-or 322 takes the encoded pseudorandom sequence 604 with the value "11010001" and the first encoded data 320A with the value "00110001" to produce the second encoded data 320B with the value "11100000".

At operation 514, the processing device stores the second encoded data 320B at the destination address 306B in a second page 304 of the memory die 324. For example, the processing device stores the second encoded data 320B with the value "11010100" at the destination address 306B within the NAND page $304_A$ at operation 514.

In some cases, the memory subsystem 110 could need to alter a field of the first encoded data 320A based on movement from one location in the memory die 324 to another location in the memory die 324 while still maintaining proper ECC encoding based on the distributive property of this encoding procedure. For example, a field in the first encoded data 320A could indicate the address where the first encoded data 320A is stored in the memory die 324 (e.g., the field records the address within the memory die 324 where the first encoded data 320A is stored) or is otherwise based on the address where the first encoded data 320A is stored in the memory devices 130. Accordingly, the field must be altered when the first encoded data 320A is moved such that it reflects the new address within the memory die 324. In these situations where the field needs to be altered, the memory subsystem 110 can employ a similar technique to that described in relation to the methods 200 and 500 and the corresponding copyback systems 300 and 600.

Figure 8:
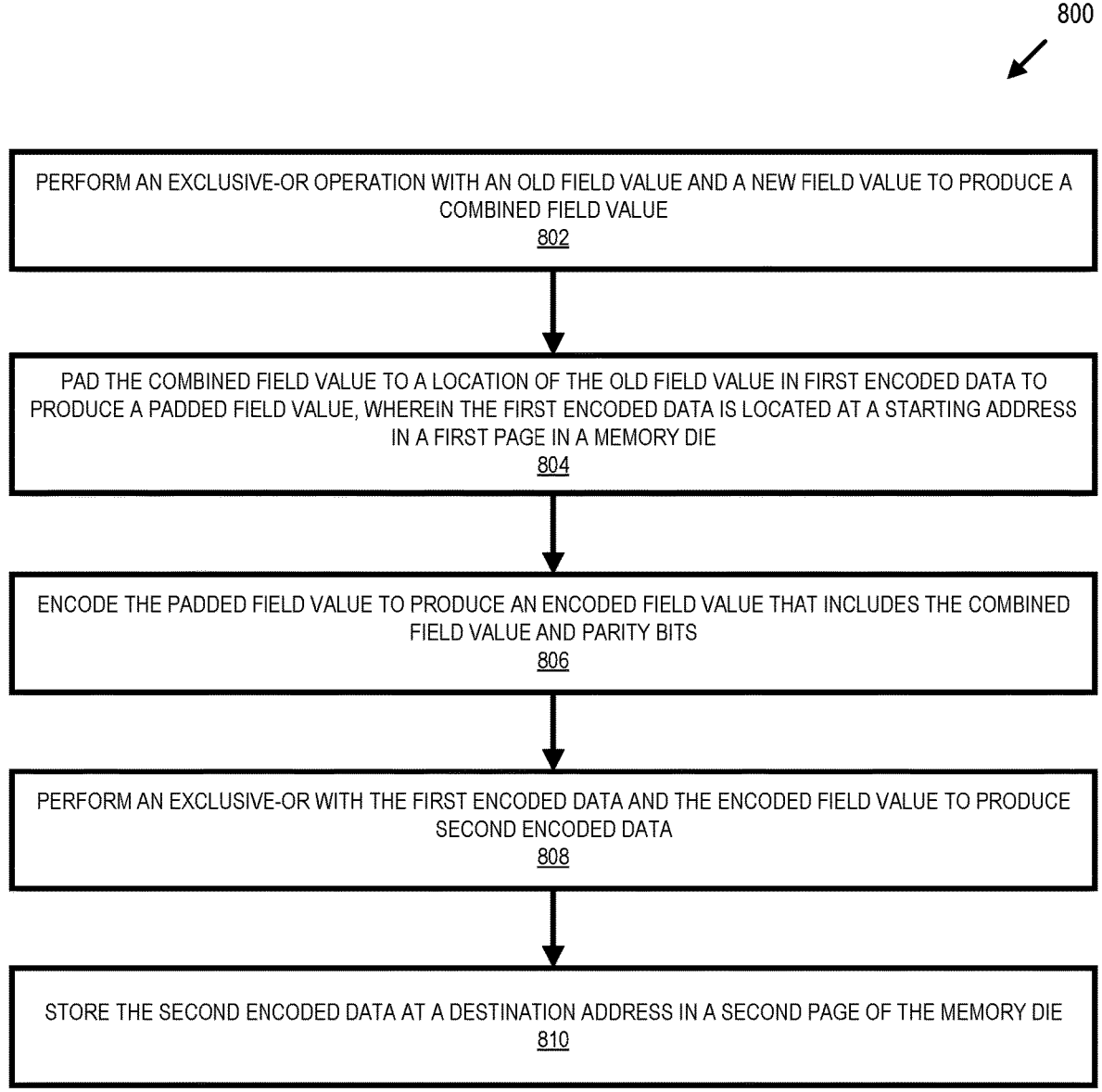
FIG. 8 is a flow diagram of a third example method to efficiently perform a copyback procedure in a memory subsystem, in accordance with some embodiments of the present disclosure.

For example, FIG. 8 is a flow diagram of yet another example method 800 to efficiently perform a copyback procedure in a memory subsystem 110, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by one or more copyback controllers 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 9:
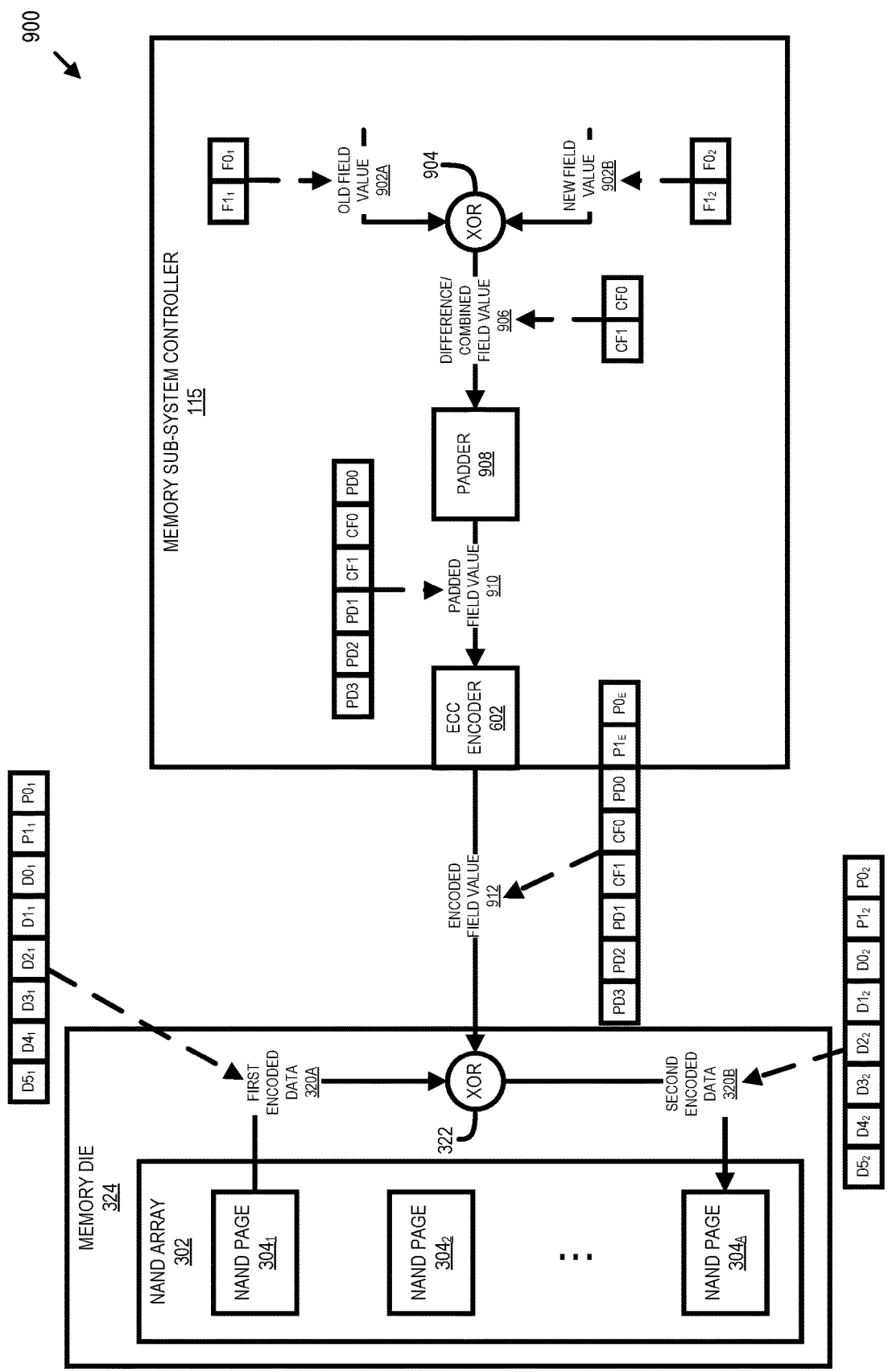
FIG. 9 illustrates a third example copyback system to perform a copyback procedure, in accordance with some embodiments of the present disclosure.

The method 800 will be described in relation to the copyback system 900 shown in FIG. 9. Although described in relation to the copyback system 900, the processing device can perform the method 800 in relation to other systems. Accordingly, the use of the copyback system 900 is for illustrative purposes.

At operation 802, the processing device combines an old field value 902A, which corresponds to data/metadata in the first encoded data 320A, with a new field value 902B, which corresponds to data/metadata to be included in the second encoded data 320B, by performing an exclusive-or with the old field value 902A and the new field value 902B to generate a difference/combined field value 906. For instance, as shown in FIG. 9, the old field value 902A can be represented by the bits $F0_1$ and $F1_1$, while the new field value 902B can be represented by the bits $F0_2$ and $F1_2$ and the combined field value 906 is represented by the bits $CF_0$ and $CF_1$. In this configuration, the exclusive-or 904 processes the old field value 902A and the new field value 902B to generate the combined field value 906. The field values 902A and 902B can represent any piece of data or metadata, including an address where the first encoded data 320A and the second encoded data 320B are respectively stored in the memory devices 130 (e.g., the field values 902A and 902B are the addresses where the first encoded data 320A and the second encoded data 320B are respectively stored in the memory devices 130 or are otherwise based on the addresses where the first encoded data 320A and the second encoded data 320B are respectively stored in the memory devices 130).

FIG. 10 shows example values for the field values 902A and 902B. In particular, FIG. 10 shows an example value of "01" for the old field value 902A and an example value of "00" for the new field value 902B. In this example, the processing device performs an exclusive-or operation with the example value of "01" for the old field value 902A and the example value of "00" for the new field value 902B to generate the combined field value 906 with the value "01". Although shown with two bits, the field values 902 may have any length (e.g., 8-64 bits).

At operation 804, the processing device pads the combined field value 906 to generate the padded field value 910. The processing device pads the combined field value 906 to generate the padded field value 910 such that the combined field value 906 is at a position in the first encoded data 320A corresponding to the old field value 902A. For instance, as shown in FIG. 9, the padded field value 910 is represented by the padding bits PD0-PD3 and the combined field value is represented by the bits CF0 and CF1. In one embodiment, padding bits are set to "0" so that they will not change the value of encoded data bits when combined via an exclusive-or operation. As shown, the three padding bits PD1-PD3 are placed on one side of the combined field value bits CF0 and CF1 and one padding bit PD0 is placed on the other side of the combined field value bits CF0 and CF1. This configuration is represented in the example value shown in FIG. 10, in which the padded field value 910 has the value "000010" based on the combined field value 906 with the value "01" and the padding configuration described above and shown in FIG. 9.

At operation 806, the processing device performs ECC encoding on the padded field value 910 to produce an encoded field value 912. For example, as shown in FIG. 9, the ECC encoder 602 processes the padded field value 910, which is represented by the padding bits PD0-PD3 and the combined field value bits CF0 and CF1, to generate the encoded field value 912, which includes the padded field value 910 (i.e., the bits PD0-PD3, CF0, and CF1), and a set of parity bits (i.e., the bits $P0_E$ and $P1_E$). In this configuration, the padded field value 910 portion of the encoded field value 912 represents the difference between (1) the data bits $D0_1$-$D5_1$ of the first encoded data 320A, which includes the old field value 902A and (2) the data bits $D0_2$-$D5_2$ of the second encoded data 320B, which is to include the new field value 902B. Further, the parity bits (i.e., the bits $P0_E$ and $P1_E$) represent the difference between (1) the parity bits $P0_1$ and $P1_1$ of the first encoded data 320A and (2) the parity bits $P0_2$ and $P1_2$ of the second encoded data 320B. As shown in the example of FIG. 10, for the example padded field value 910 of "000010", the processing device generates the encoded field value 912 with the value "00001010".

At operation 808, the processing device combines the encoded field value 912 and the first encoded data 320A by performing an exclusive-or with the encoded field value 912 and the first encoded data 320A to produce the second encoded data 320B. For example, as shown in FIG. 9, the exclusive-or 322 takes the encoded field value 912 and the first encoded data 320A to produce the second encoded data 320B. In this configuration, while the first encoded data 320A includes the old field value 902A with corresponding old parity bits $P0_1$ and $P1_1$, the second encoded data 320B includes the new field value 902B with corresponding new parity bits $P0_2$ and $P1_2$. For instance, as shown in FIG. 10, the exclusive-or 322 takes the encoded field value 912 with the value "00101001" and the first encoded data 320A with the value "00110001" to produce the second encoded data 320B with the value "00100011".

At operation 810, the processing device stores the second encoded data 320B at the destination address 306B in a second page 304 of the memory die 324. For example, the processing device stores the second encoded data 320B with the value "00100011" at a destination address within the NAND page $304_A$ at operation 810.

In some cases, the memory subsystem 110 could need to both alter (1) a field of the first encoded data 320A and (2) a scrambling seed 310 based on movement from one location in the memory die 324 to another location in the memory die 324, while still maintaining proper ECC encoding based on the distributive property of this encoding procedure. In these situations, the memory subsystem 110 can employ a similar technique to that described in relation to the methods 200, 500, and 800 and the corresponding copyback systems 300, 600, and 900.

Figure 11:
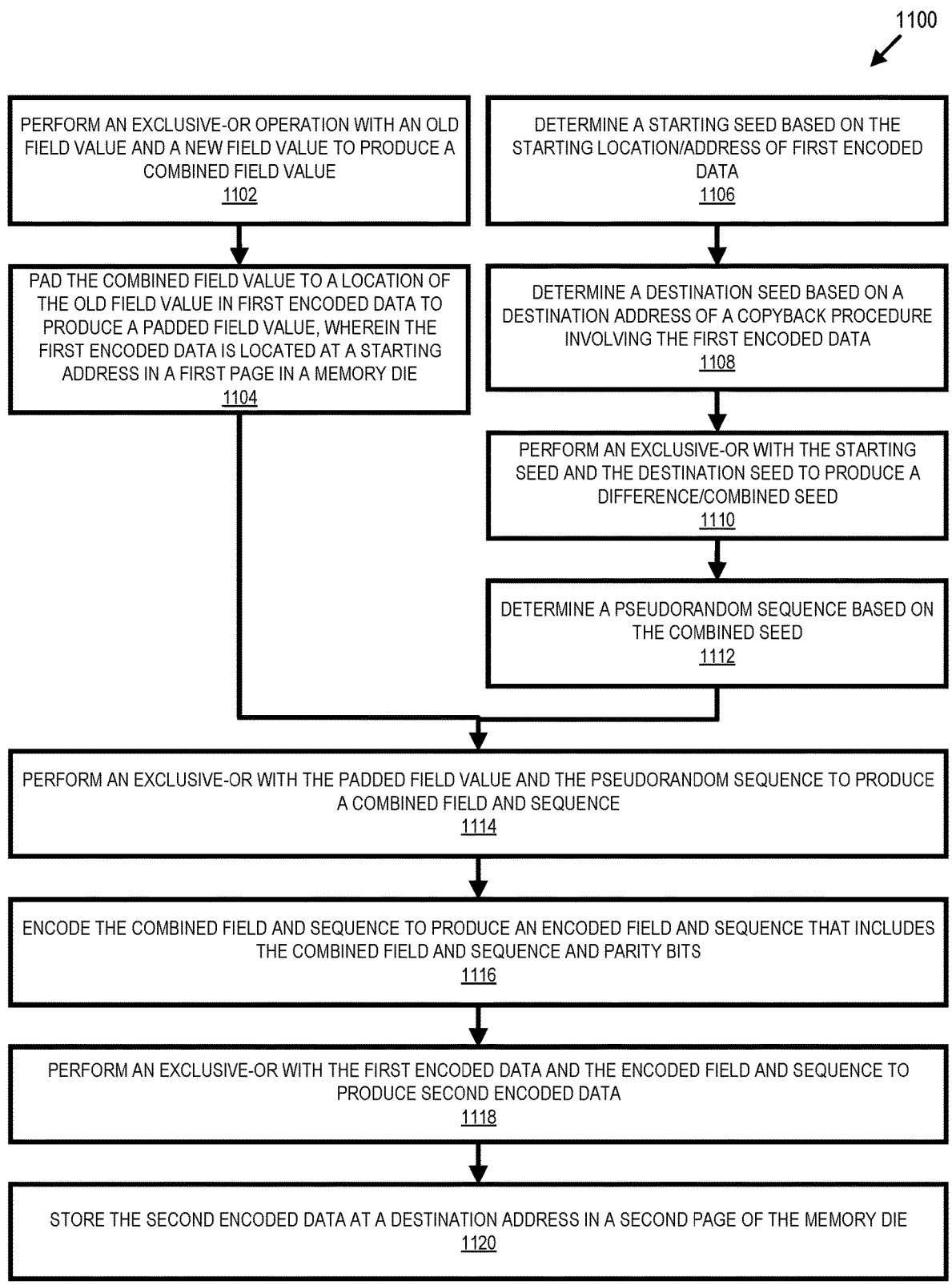
FIG. 11 is a flow diagram of a fourth example method to efficiently perform a copyback procedure in a memory subsystem, in accordance with some embodiments of the present disclosure.

For example, FIG. 11 is a flow diagram of still another example method 1100 to efficiently perform a copyback procedure in a memory subsystem 110, in accordance with some embodiments of the present disclosure. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by one or more copyback controllers 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 12:
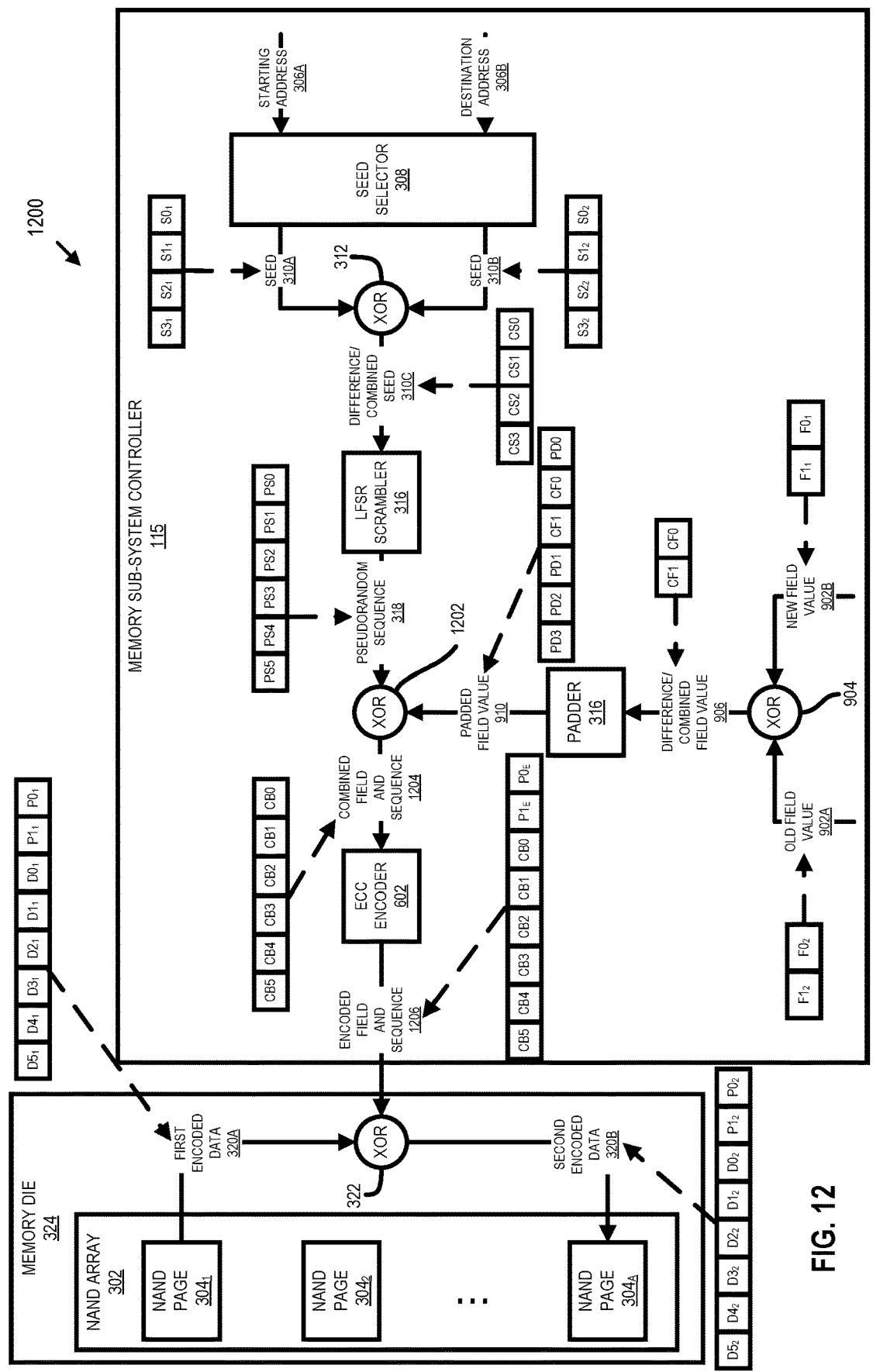
FIG. 12 illustrates a fourth example copyback system to perform a copyback procedure, in accordance with some embodiments of the present disclosure.

The method 1100 will be described in relation to the copyback system 1200 shown in FIG. 12. Although described in relation to the copyback system 1200, the processing device can perform the method 1100 in relation to other systems. Accordingly, the use of the copyback system 1200 is for illustrative purposes.

As shown in FIG. 11, the processing device can perform the operations 1102 and 1104 in a similar fashion to the operations 802 and 804 of the method 800, respectively. Namely, since the first encoded data 320A includes an old field value 902A but needs to include a new field value 902B, the processing device generates a padded field value 910 that includes the combined field value 906 with padding to the correct position in the first encoded data 320A in the same way as performed in the method 800.

Similarly, the processing device can perform the operations 1106-1112 in a similar fashion to the operations 502-508 of the method 500, respectively. Namely, since the first encoded data 320A is also scrambled using a starting seed 310A but needs to be scrambled using the destination seed 310B, generating a pseudorandom sequence 318 based on the starting seed 310A and the destination seed 310B can be accomplished in the same way in the method 1100 using the techniques of the method 500.

Following generating of the padded field value 910 at operation 1104 and the pseudorandom sequence 318 at operation 1112, the processing device combines the padded field value 910 and the pseudorandom sequence 318 by performing an exclusive-or with the padded field value 910 and the pseudorandom sequence 318 to generate a combined field and sequence 1204 at operation 1114. For example, as shown in FIG. 12, the exclusive-or 1202 takes the padded field value 910 and the pseudorandom sequence 318 to generate the combined field and sequence 1204, which is represented by the bits CB0-CB5. The combined field and sequence 1204 represents the difference between (1) the field values 902A and 902A and (2) the seeds 310A and 310B. As shown in the example values of FIG. 13, the exclusive-or 1202 combines the pseudorandom sequence 318 with the value "110100" and the padded field value 910 with the value "000010" to produce the combined field and sequence 1204 with the value "110110".

At operation 1116, the processing device performs ECC encoding on the combined field and sequence 1204 to produce an encoded field and sequence 1206. For example, as shown in FIG. 12, the ECC encoder 602 processes the combined field and sequence 1204, which is represented by the six bits CB0-CB5, to generate the encoded field and sequence 1206, which includes the combined field and sequence 1204 (i.e., the bits 4B0-4B5) and a set of parity bits (i.e., the bits $P0_E$ and $P1_E$). In this configuration, the combined field and sequence 1204 portion of the encoded field and sequence 1206 represents the difference between (1) the data bits $D0_1$-$D5_1$ of the first encoded data 320A, which are scrambled based on the seed 310A and include the old field value 902A and (2) the data bits $D0_2$-$D5_2$ of the second encoded data 320B, which are to be scrambled based on the seed 310B and are to include the new field value 902B. Further, the parity bits (i.e., the bits $P0_E$ and $P1_E$) represent the difference between (1) the parity bits $P0_1$ and $P1_1$ of the first encoded data 320A and (2) the parity bits $P0_2$ and $P1_2$ of the second encoded data 320B. As shown in the example values of FIG. 13, the ECC encoder 602 takes the combined field and sequence 1204 to produce the encoded field and sequence 1206 with the value "11011011", which corresponds to the combined field and sequence 1204 with the value "110110" and the new parity bits "11".

At operation 1118, the processing device combines the encoded field and sequence 1206 and the first encoded data 320A by performing an exclusive-or with the encoded field and sequence 1206 and the first encoded data 320A to produce the second encoded data 320B. For example, as shown in FIG. 12, the exclusive-or 322 takes the encoded field and sequence 1206 and the first encoded data 320A to produce the second encoded data 320B. In this configuration, while the first encoded data 320A is scrambled using the seed 310A and includes the old field value 902A, the second encoded data 320B is scrambled using the seed 310B and includes the new field value 902B while still maintaining proper ECC encoding based on the distributive property of this encoding procedure. For instance, as shown in FIG. 13, the exclusive-or 322 takes the encoded field and sequence 1206 with the value "11011011" and the first encoded data 320A with the value "00101001" to produce the second encoded data 320B with the value "11100010".

At operation 1120, the processing device stores the second encoded data 320B at the destination address 306B in a second page 304. For example, the processing device stores the second encoded data 320B with the value "11100010" at the destination address 306B within the NAND page $304_A$ at operation 1114.

Figure 14:
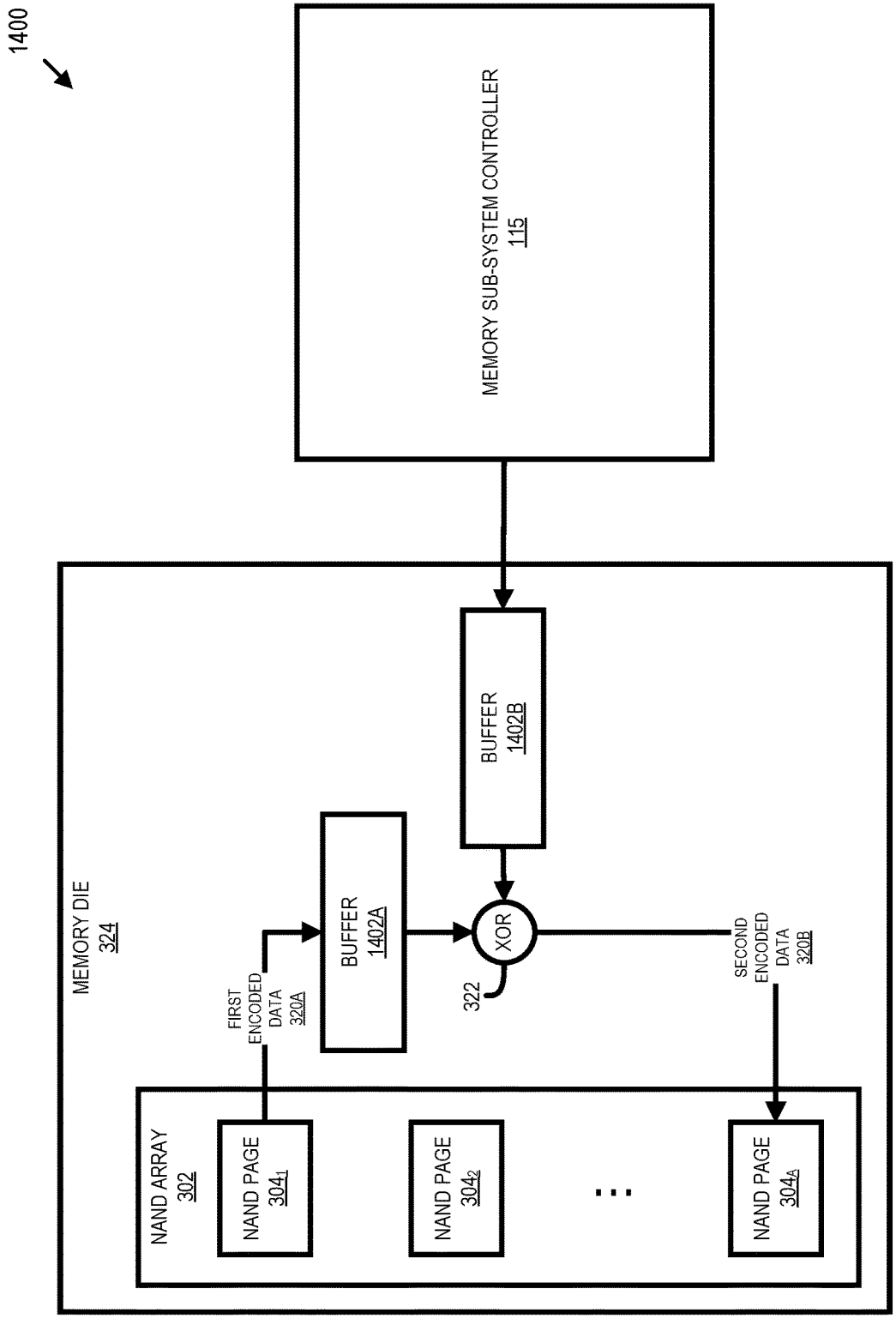
FIG. 14 illustrates a fifth copyback system with a pair of buffers, which can be used in conjunction with any one of the first, second, third, and fourth copyback systems, in accordance with some embodiments of the present disclosure.

Although shown as the controller 115 transmitting/passing values to the memory die 324 such that these values are combined as the first encoded data 320A is transferred between NAND pages 304, in other embodiments, the copyback controllers 113 and/or each of the copyback systems 300, 600, 900, and 1200 can utilize a set of buffers 1402 to facilitate the transfer and combination. For example, FIG. 14 shows a copyback system 1400 that includes a first buffer 1402A, which stores/receives the first encoded data 320A from the NAND page $304_1$, and a second buffer 1402B, which stores/receives values from the controller 115 (e.g., a pseudorandom sequence 318, an encoded pseudorandom sequence 604, an encoded field value 912, and/or an encoded field and sequence 1206). As entries are populated/stored in each buffer 1402A and 1402B, the entries can be combined using the exclusive-or 322 to produce the second encoded data 320B for storage in the NAND page $304_4$.

Figure 15:
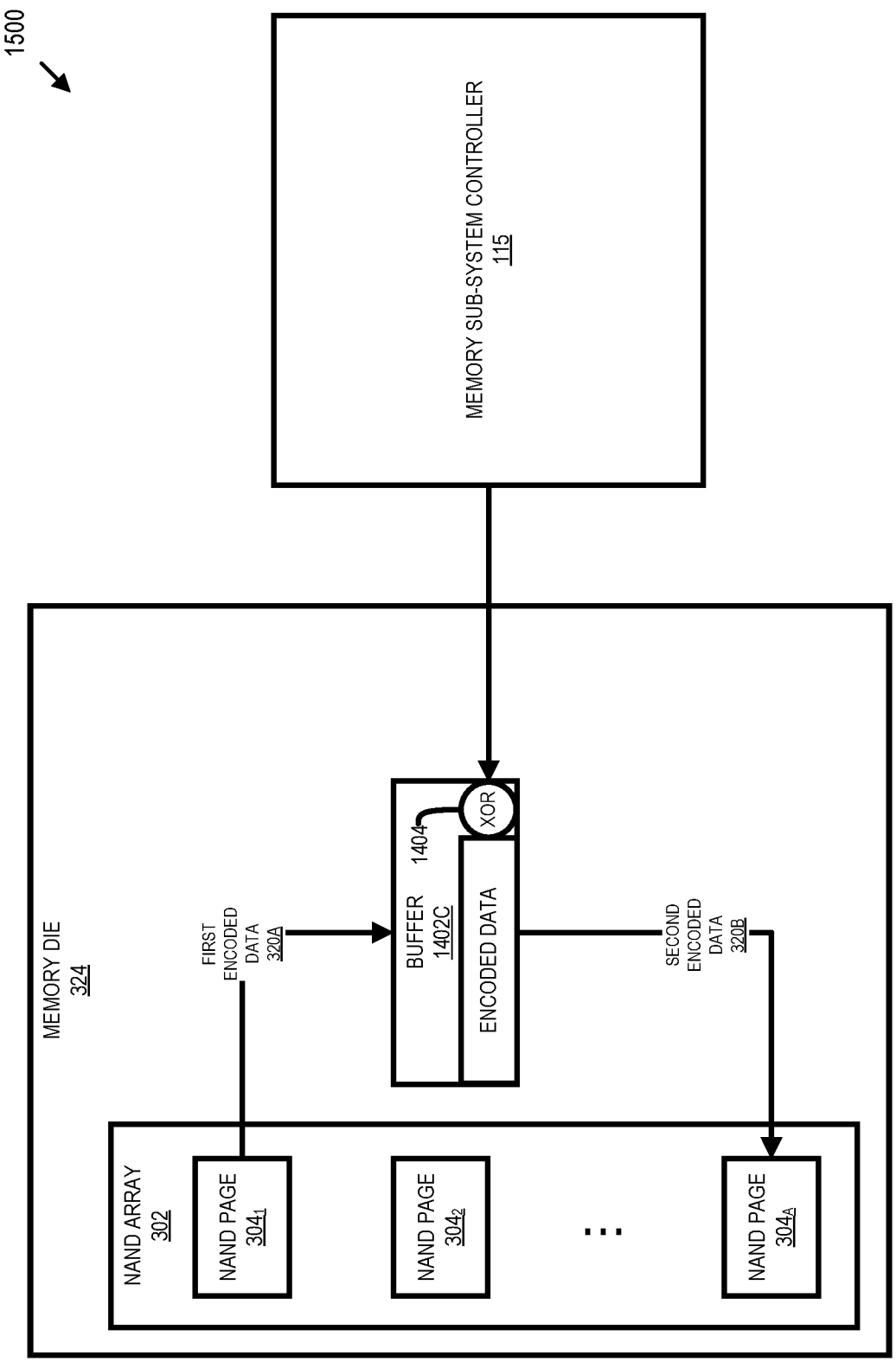
FIG. 15 illustrates a sixth copyback system with a single buffer, which can be used in conjunction with any one of the first, second, third, and fourth copyback systems, in accordance with some embodiments of the present disclosure.

Alternatively, the copyback controllers 113 and/or each of the copyback systems 300, 600, 900, and 1200 can utilize a single buffer to facilitate the transfer and combination. For example, FIG. 15 shows a copyback system 1500 that includes a single buffer 1402C, which stores/receives the first encoded data 320A from the NAND page $304_1$. In this example, values from the controller 115 (e.g., a pseudorandom sequence 318, an encoded pseudorandom sequence 604, an encoded field value 912, and/or an encoded field and sequence 1206) are passed directly to the buffer 1402C such that the values from the controller 115 are combined with the first encoded data 320A in the buffer 1402C to produce the second encoded data 320B for storage in the NAND page $304_4$. Accordingly, in this embodiment, the combination (e.g., using the exclusive-or 1404) is performed as the first encoded data 320A sits in the buffer 1402C. Although described as the buffer 1402C storing the first encoded data 320A and a value from the controller 115 being combined with the first encoded data 320A while the first encoded data 320A resides in the buffer 1402C, in some embodiments, the buffer 1402C can store values from the controller 115 instead of the first encoded data 320A. In these embodiments, a value from the controller 115 is combined with the first encoded data 320A while the value from the controller 115 resides in the buffer 1402C.

Figure 16:
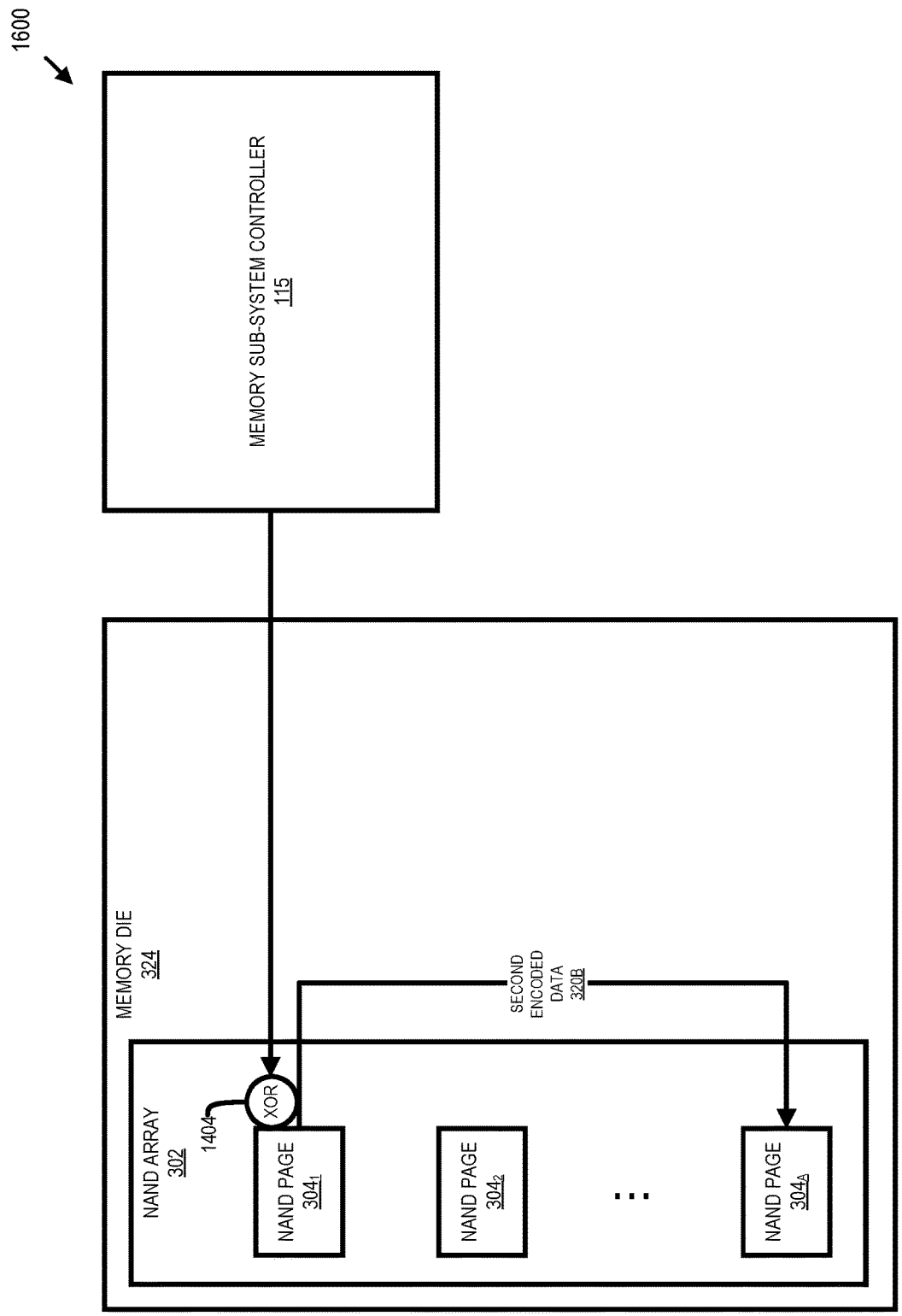
FIG. 16 illustrates a seventh copyback system with a controller delivering values directly to a starting NAND page, which can be used in conjunction with any one of the first, second, third, and fourth copyback systems, in accordance with some embodiments of the present disclosure.
Figure 17:
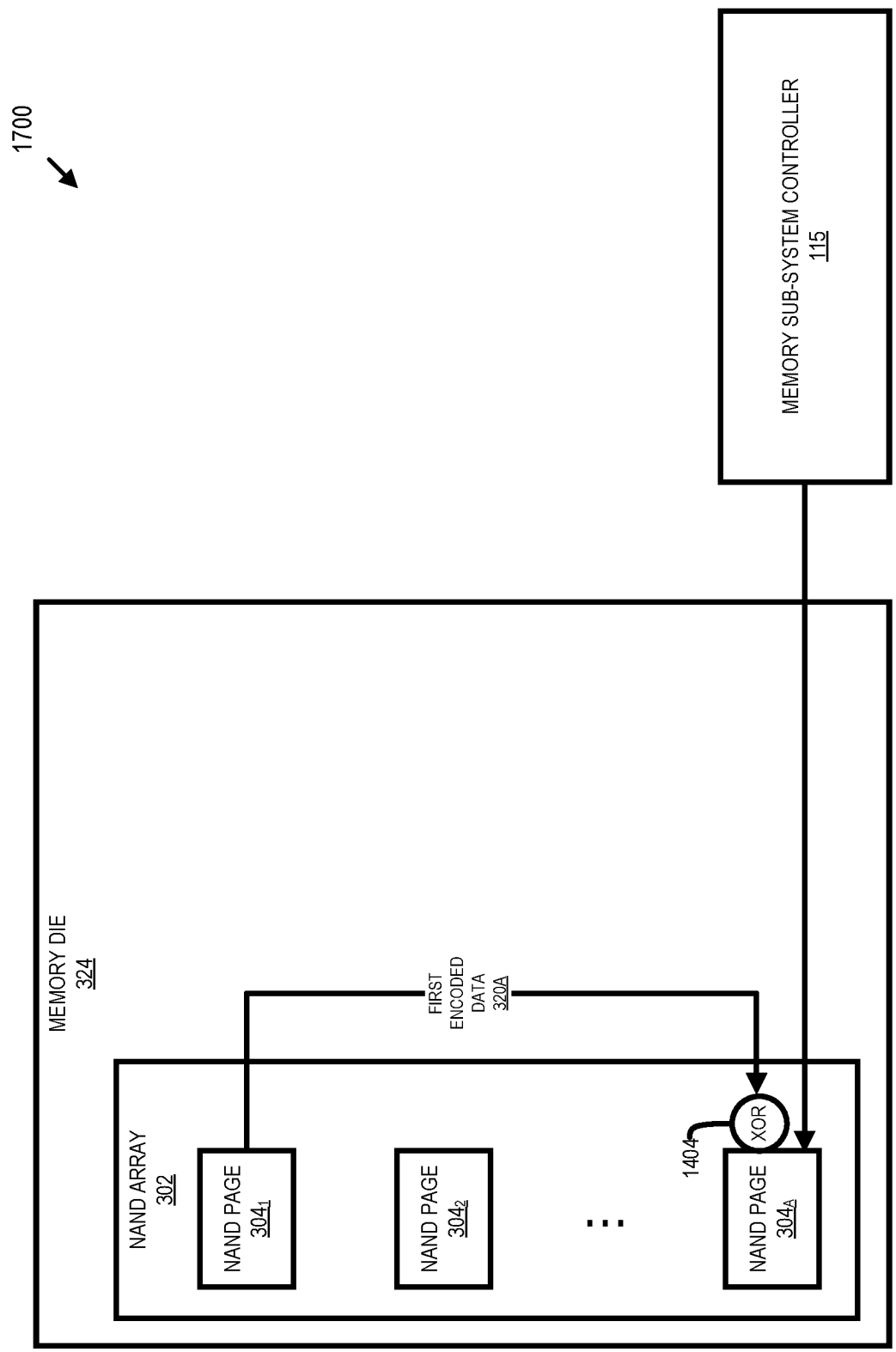
FIG. 17 illustrates an eighth copyback system with a controller delivering values directly to a destination NAND page, which can be used in conjunction with any one of the first, second, third, and fourth copyback systems, in accordance with some embodiments of the present disclosure.

In some embodiments, the copyback controllers 113 and/or each of the copyback systems 300, 600, 900, and 1200 combine the first encoded data 320A with values from the controller 113 while the first encoded data resides in a NAND page 304. For example, as shown in the copyback system 1600 of FIG. 16, the values from the controller 115 (e.g., a pseudorandom sequence 318, an encoded pseudorandom sequence 604, an encoded field value 912, and/or an encoded field and sequence 1206) are passed directly to the NAND page $304_1$ such that the values from the controller 115 are combined (e.g., using the exclusive-or 1404) with the first encoded data 320A in the NAND page $304_1$ to produce the second encoded data 320B for storage in the NAND page $304_A$. In another example, as shown in the copyback system 1700 of FIG. 17, the values from the controller 115 (e.g., a pseudorandom sequence 318, an encoded pseudorandom sequence 604, an encoded field value 912, and/or an encoded field and sequence 1206) are passed directly to the NAND page $304_A$. In this embodiment, the first encoded data 320A is moved to the NAND page $304_A$ without alteration such that the values from the controller 115 are combined (e.g., using the exclusive-or 1404) with the first encoded data 320A in the NAND page $304_A$ to produce the second encoded data 320B.

Figure 18:
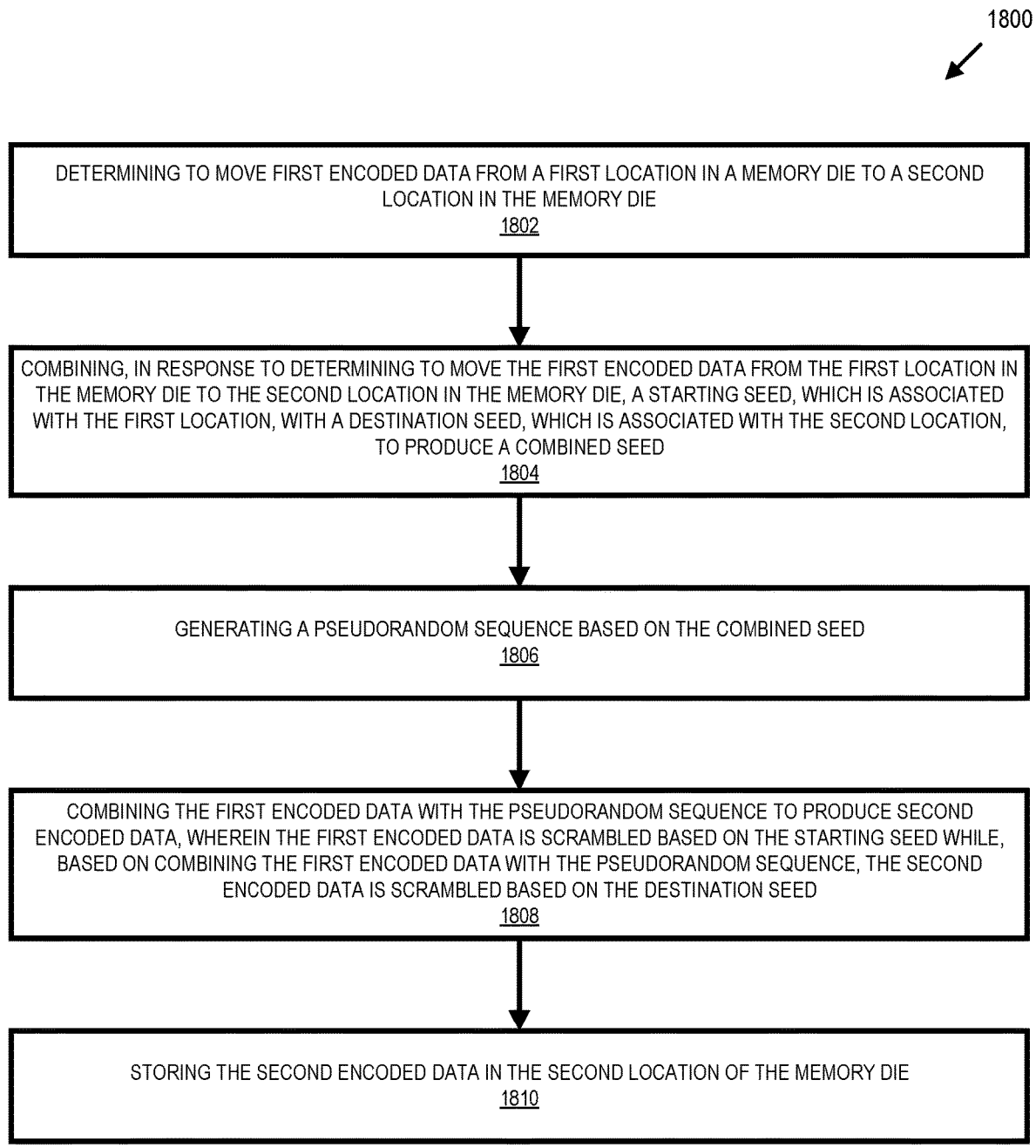
FIG. 18 a flow diagram of a fifth example method to efficiently perform a copyback procedure in a memory subsystem, in accordance with some embodiments of the present disclosure.

FIG. 18 is a flow diagram of an additional example method 1800 to efficiently perform a copyback procedure in a memory subsystem 110, in accordance with some embodiments of the present disclosure. The method 1800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1800 is performed by one or more copyback controllers 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1802, the processing device determines to move first encoded data from a first location in a memory die to a second location in the memory die. For example, while performing garbage collection, the processing device can determine to move the first encoded data 320A from the starting address 306A in the NAND page $304_1$ to the destination address 306B in the NAND page $304_A$ at operation 1802.

At operation 1804, in response to determining to move the first encoded data from the first location in the memory die to the second location in the memory die, the processing device combines a starting seed, which is associated with the first location, with a destination seed, which is associated with the second location, to produce a combined seed. For example, the processing device can combine the seed 310A (i.e., the starting seed), which is associated with the starting address 306A in the NAND page $304_1$, with the seed 310B (i.e., the destination seed), which is associated with the destination address 306B in the NAND page $304_A$, to produce the combined seed 310C at operation 1804. This combination can be performed using an exclusive-or operation.

At operation 1806, the processing device generates a pseudorandom sequence based on the combined seed. For example, the processing device can generate the pseudorandom sequence 318 based on the combined seed 310C using the LFSR scrambler 316 at operation 1806.

At operation 1808, the processing device combines the first encoded data with the pseudorandom sequence to produce second encoded data. In this configuration, the first encoded data is scrambled based on the starting seed while, based on combining the first encoded data with the pseudorandom sequence, the second encoded data is scrambled based on the destination seed. For example, the processing device can combine the pseudorandom sequence 318 with the first encoded data 320A to produce the second encoded data 320B. Based on the distributive property of the scrambling technique employed by the LFSR scrambler 316, the second encoded data 320B is now encoded/scrambled using the seed 310B instead of the seed 310A, which was used to scramble the first encoded data 320A.

At operation 1810, the processing device stores the second encoded data in the second location of the memory die. For example, the processing device stores the second encoded data 320B at the destination address 306B in the NAND page $304_A$ at operation 1810. Accordingly, the processing device has completed the copyback procedure while still maintaining proper scrambling of the data according to the location of the data in storage based on the distributive property of this scrambling/encoding procedure.

Although described as the processing devices performing or supporting the performance of copyback procedures, the techniques and systems described herein are not limited to these situations. In particular, the processing devices described herein can perform one or more operations from the methods 200, 500, 800, 1100, and 1800 as part of any scenario that requires efficient (1) modification of a scrambler seed for encoded data, (2) update to ECC for encoded data, and/or (3) modification of field values for encoded data.

Figure 19:
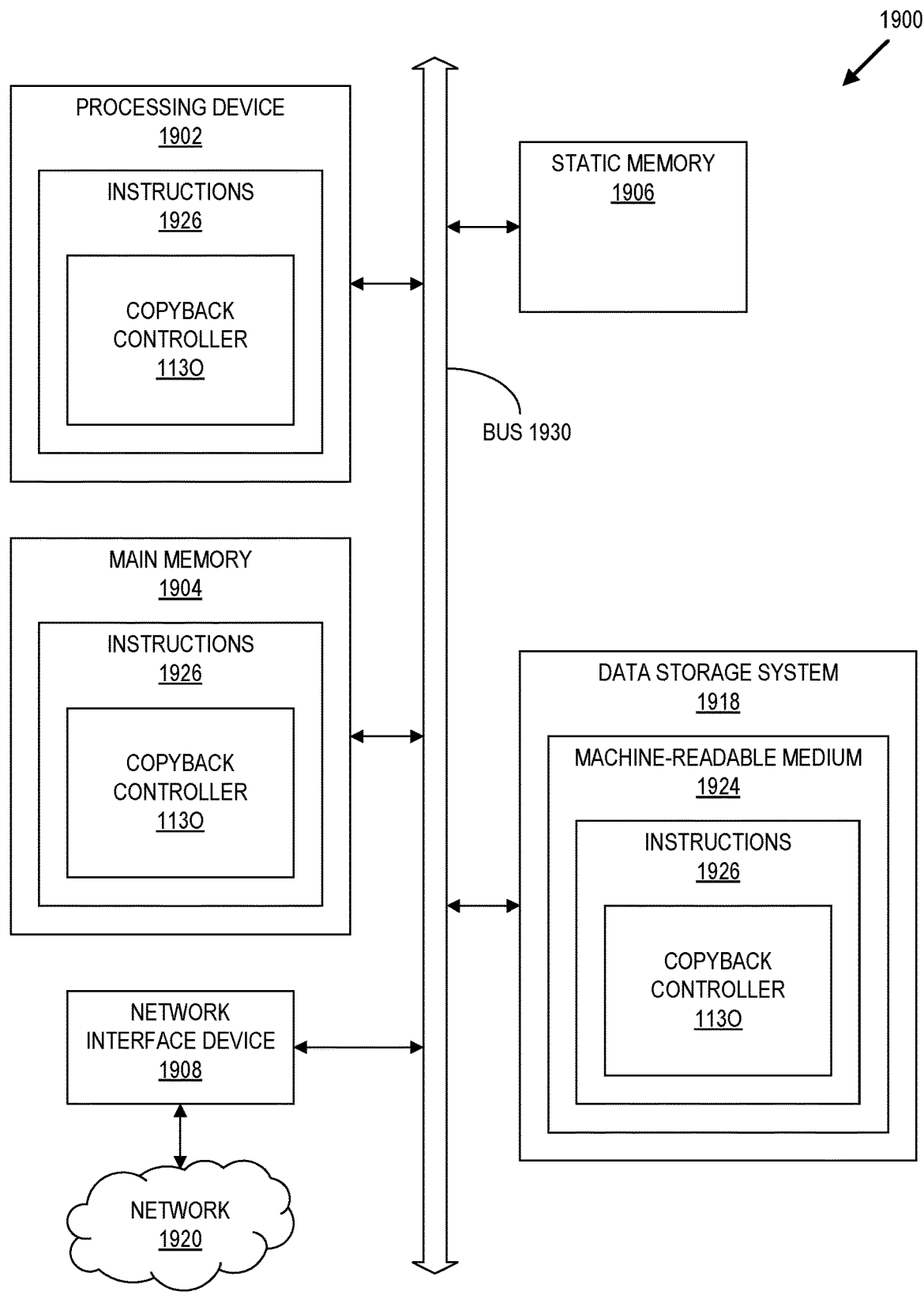
FIG. 19 is a block diagram of an example computer system in which embodiments of the present disclosure may operate.

FIG. 19 illustrates an example machine of a computer system 1900 within which a set of instructions, for causing the machine to perform any one or more of the methodologies discussed herein, can be executed. In some embodiments, the computer system 1900 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the copyback controller(s) 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1900 includes a processing device 1902, a main memory 1904 (e.g., read-only memory (ROM), flash memory, dynamic random access memory (DRAM) such as synchronous DRAM (SDRAM) or Rambus DRAM (RDRAM), etc.), a static memory 1906 (e.g., flash memory, static random access memory (SRAM), etc.), and a data storage system 1918, which communicate with each other via a bus 1930.

Processing device 1902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1902 can also be one or more special-purpose processing devices such as an application specific integrated circuit (ASIC), a field programmable gate array (FPGA), a digital signal processor (DSP), network processor, or the like. The processing device 1902 is configured to execute instructions 1926 for performing the operations and steps discussed herein. The computer system 1900 can further include a network interface device 1908 to communicate over the network 1920.

The data storage system 1918 can include a machine-readable storage medium 1924 (also known as a computer-readable medium) on which is stored one or more sets of instructions 1926 or software embodying any one or more of the methodologies or functions described herein. The instructions 1926 can also reside, completely or at least partially, within the main memory 1904 and/or within the processing device 1902 during execution thereof by the computer system 1900, the main memory 1904 and the processing device 1902 also constituting machine-readable storage media. The machine-readable storage medium 1924, data storage system 1918, and/or main memory 1904 can correspond to the memory subsystem 110 of FIG. 1.

In one embodiment, the instructions 1926 include instructions to implement functionality corresponding to a copyback controller (e.g., the copyback controller(s) 113 of FIG. 1). While the machine-readable storage medium 1924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115 and/or the memory devices 130, may carry out the computer-implemented methods 200, 500, 800, 1100, and 1800 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

determining to move first encoded data from a first location in a memory die to a second location in the memory die;

combining, in response to determining to move the first encoded data from the first location in the memory die to the second location in the memory die, a starting seed, which is associated with the first location, with a destination seed, which is associated with the second location, to produce a combined seed;

generating a pseudorandom sequence based on the combined seed;

combining the first encoded data with the pseudorandom sequence to produce second encoded data, wherein the first encoded data is scrambled based on the starting seed while, based on combining the first encoded data with the pseudorandom sequence, the second encoded data is scrambled based on the destination seed; and storing the second encoded data in the second location of the memory die.

2. The method of claim 1, further comprising:

performing error correcting code (ECC) encoding on the pseudorandom sequence prior to combining with the first encoded data to produce the second encoded data such that parity bits produced by performing the ECC encoding are combined with parity bits in the first encoded data to produce parity bits in the second encoded data.

3. The method of claim 1, further comprising:

determining that a first field value in the first encoded data is to be changed to a second field value in response to determining that the first encoded data is to move from the first location to the second location;

combining the first field value with the second field value to produce a combined field value; and padding the combined field value to produce a padded field value, wherein the combined field value is positioned in the padded field value to correspond to a position of the first field value in the first encoded data.

4. The method of claim 3, further comprising:

combining the padded field value with the pseudorandom sequence prior to combining with the first encoded data; and performing ECC encoding on the pseudorandom sequence after combining the padded field value with the pseudorandom sequence but prior to combining with the first encoded data.

5. The method of claim 3, wherein the first field value is a value based on an address of the first location and the second field value is a value based on an address of the second location.

6. The method of claim 3, wherein each combining is performed with an exclusive-or operation.

7. The method of claim 1, wherein combining the first encoded data with the pseudorandom sequence to produce the second encoded data is performed by logic within the memory die.

8. A non-transitory computer-readable storage medium comprising instructions that, when executed by a processing device, cause the processing device to:

determine to move first encoded data from a first location in a memory die to a second location in the memory die;

combine, in response to determining to move the first encoded data from the first location in the memory die to the second location in the memory die, a starting seed, which is associated with the first location, with a destination seed, which is associated with the second location, to produce a combined seed;

generate a pseudorandom sequence based on the combined seed;

combine the first encoded data with the pseudorandom sequence to produce second encoded data, wherein the first encoded data is scrambled based on the starting seed while, based on combining the first encoded data with the pseudorandom sequence, the second encoded data is scrambled based on the destination seed; and store the second encoded data in the second location of the memory die.

9. The non-transitory computer-readable medium of claim 8, wherein the processing device is further to:

perform error correcting code (ECC) encoding on the pseudorandom sequence prior to combining with the first encoded data to produce the second encoded data such that parity bits produced by performing the ECC encoding are combined with parity bits in the first encoded data to produce parity bits in the second encoded data.

10. The non-transitory computer-readable medium of claim 8, wherein the processing device is further to:

determine that a first field value in the first encoded data is to be changed to a second field value in response to determining that the first encoded data is to move from the first location to the second location;

combine the first field value with the second field value to produce a combined field value; and pad the combined field value to produce a padded field value, wherein the combined field value is positioned in the padded field value to correspond to a position of the first field value in the first encoded data.

11. The non-transitory computer-readable medium of claim 10, wherein the processing device is further to:

combine the padded field value with the pseudorandom sequence prior to combining with the first encoded data; and perform ECC encoding on the pseudorandom sequence after combining the padded field value with the pseudorandom sequence but prior to combining with the first encoded data.

12. The non-transitory computer-readable medium of claim 10, wherein the first field value is a value based on an address of the first location and the second field value is a value based on an address of the second location.

13. The non-transitory computer-readable medium of claim 10, wherein each combining is performed with an exclusive-or operation.

14. The non-transitory computer-readable medium of claim 8, wherein combining the first encoded data with the pseudorandom sequence to produce the second encoded data is performed by logic within the memory die.

15. A system comprising:

a memory device; and a processing device, operatively coupled with the memory device, to:

combine a starting seed, which is associated with a first location in a first page of the memory device, with a destination seed, which is associated with a second location in a second page of the memory device, to produce a combined seed;

generate a pseudorandom sequence based on the combined seed;

combine the first encoded data with the pseudorandom sequence to produce second encoded data, wherein the first encoded data is scrambled based on the starting seed while, based on combining the first encoded data with the pseudorandom sequence, the second encoded data is scrambled based on the destination seed, wherein combining the first encoded data with the pseudorandom sequence to produce the second encoded data is performed by logic within the memory device; and store the second encoded data in the second location of the memory device.

16. The system of claim 15, wherein the processing device is further to:

perform error correcting code (ECC) encoding on the pseudorandom sequence prior to combining with the first encoded data to produce the second encoded data such that parity bits produced by performing the ECC encoding are combined with parity bits in the first encoded data to produce parity bits in the second encoded data.

17. The system of claim 15, wherein the processing device is further to:
    determine that a first field value in the first encoded data is to be changed to a second field value;
    combine the first field value with the second field value to produce a combined field value; and
    pad the combined field value to produce a padded field value, wherein the combined field value is positioned in the padded field value to correspond to a position of the first field value in the first encoded data.

18. The system of claim 17, wherein the processing device is further to:
    combine the padded field value with the pseudorandom sequence prior to combining with the first encoded data; and
    perform ECC encoding on the pseudorandom sequence after combining the padded field value with the pseudorandom sequence but prior to combining with the first encoded data.

19. The system of claim 17, wherein the first field value is a value based on an address of the first location and the second field value is a value based on an address of the second location.

20. The system of claim 17, wherein each combining is performed with an exclusive-or operation.

* * * * *